(12) United States Patent
Chao et al.

(10) Patent No.: US 8,441,798 B2
(45) Date of Patent: May 14, 2013

(54) MOUNTING ADAPTER FOR MOUNTING ELECTRONIC DEVICE ON SUPPORT RAIL

(75) Inventors: George Yee-ho Chao, Burnaby (CA); Todd Mawhinney, Surrey (CA)

(73) Assignee: Cooper Technologies Company, Houston, TX (US)

( * ) Notice: Subject to any disclaimer, the term of this patent is extended or adjusted under 35 U.S.C. 154(b) by 342 days.

(21) Appl. No.: 12/767,267

(22) Filed: Apr. 26, 2010

(65) Prior Publication Data

US 2011/0261549 A1     Oct. 27, 2011

(51) Int. Cl.
*H05K 7/00*       (2006.01)
(52) U.S. Cl.
USPC ........................................................ 361/747
(58) Field of Classification Search ............... 361/747, 361/679.05, 679.58, 702, 704, 718, 741, 361/742, 816
See application file for complete search history.

(56) References Cited

U.S. PATENT DOCUMENTS

| | | | |
|---|---|---|---|
| 7,738,241 B2 * | 6/2010 | Hsieh et al. ................. | 361/679.1 |
| 2010/0134987 A1 * | 6/2010 | Furholzer ...................... | 361/747 |
| 2010/0188824 A1 * | 7/2010 | Benedetto et al. ............ | 361/747 |
| 2010/0277379 A1 * | 11/2010 | Lindackers et al. .......... | 343/713 |
| 2011/0069471 A1 * | 3/2011 | Higson .......................... | 361/829 |

* cited by examiner

*Primary Examiner* — Jeremy Norris
*Assistant Examiner* — Tremesha S Willis
(74) *Attorney, Agent, or Firm* — Armstrong Teasdale LLP (57) ABSTRACT

A mounting adapter for mounting a device on a support rail includes a central body, at least one rail attaching member, and at least one detent. The rail attaching member projects rearward from the body and is configured for releasable attachment to at least one of the upper and lower flanges of the support rail. The detent projects forward from the body. The detent is resiliently deflectable relative to the body and configured for releasable attachment to the electronic device.

32 Claims, 11 Drawing Sheets

MOUNTING ADAPTER FOR MOUNTING ELECTRONIC DEVICE ON SUPPORT RAIL

BACKGROUND OF THE INVENTION

The field of the invention relates generally to electronic devices, and more specifically to industrial control and communication devices for mounting on a support rail.

Supervisory Control and Data Acquisition (SCADA) systems are in widespread use for monitoring and controlling industrial processes of all types. Such SCADA systems typically include a number of remotely monitored locations including sensors, and data and information associated with the sensors at each of the remotely monitored location are communicated to other locations in the system, and ultimately to a centralized computer system that manages data collected and controls operation of the system. Control commands can likewise be sent to the remote locations using a communications network. In certain applications, the use of long range radio devices in the communication networks are a practical necessity, and thus have generally been adopted in certain industries for SCADA systems.

It is generally known that radio devices and other industrial control and communication devices for the SCADA system can be mounted inside equipment racks or other types of housings. There are several known means of mounting these devices in the equipment racks. Each of these known mounting means has its own advantages and disadvantages, and the field technician installing the devices may have a preference for one over the others, depending on certain factors and situations encountered in the field. Accordingly, it would be desirable for a field technician to be capable of selecting between more than one of the mounting means and quickly and easily implementing the selected mounting means in the field.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

In general, a Deutsche Industrie Normen ("DIN") rail, also known as a top-hat rail, is a metal rail having a hat-shaped cross section. Examples of standardized DIN rails are set forth in European Standard EN 50022 and IEC International Standard 60715. The DIN rail is used, for example, to quickly and easily mount electronic devices, such as industrial control and communication devices, inside equipment racks or other housings.

In order to readily attach to the DIN rail, the electronic device must be configured with rail attaching members that form a DIN clip. Some types of electronic devices include housings with integrally formed, non-removable rail attaching members. For example, the housing and the rail attaching members of a particular device may be formed as a molded, one-piece component. Other types of electronic devices do not include integrally formed rail attaching members. Instead, a conventional mounting adapter that includes the rail attaching members may be fastened to the back of the device using a threaded fastener (e.g., a screw).

The two conventional ways of configuring the electronic device for mounting on the DIN rail each has its own shortcomings. For example, the device with the housing formed with integral rail attaching members is limited in use in that it can be mounted only on a DIN rail because the rail attaching members are non-removable. Thus, the device cannot be mounted directly to a wall or panel of the equipment rack. Although the conventional mounting adapter described above allows for the electronic device to be mounted in more than one way, the use of a threaded fastener to attach the adapter to the device makes attaching and detaching the adapter cumbersome and time-consuming in the field. Moreover, some types of electronic devices include electrical or electronic components that are adjacent to a back plate of the device. Threading a fastener through the back plate may damage the electrical or electronic components inside the device.

Figure 1:
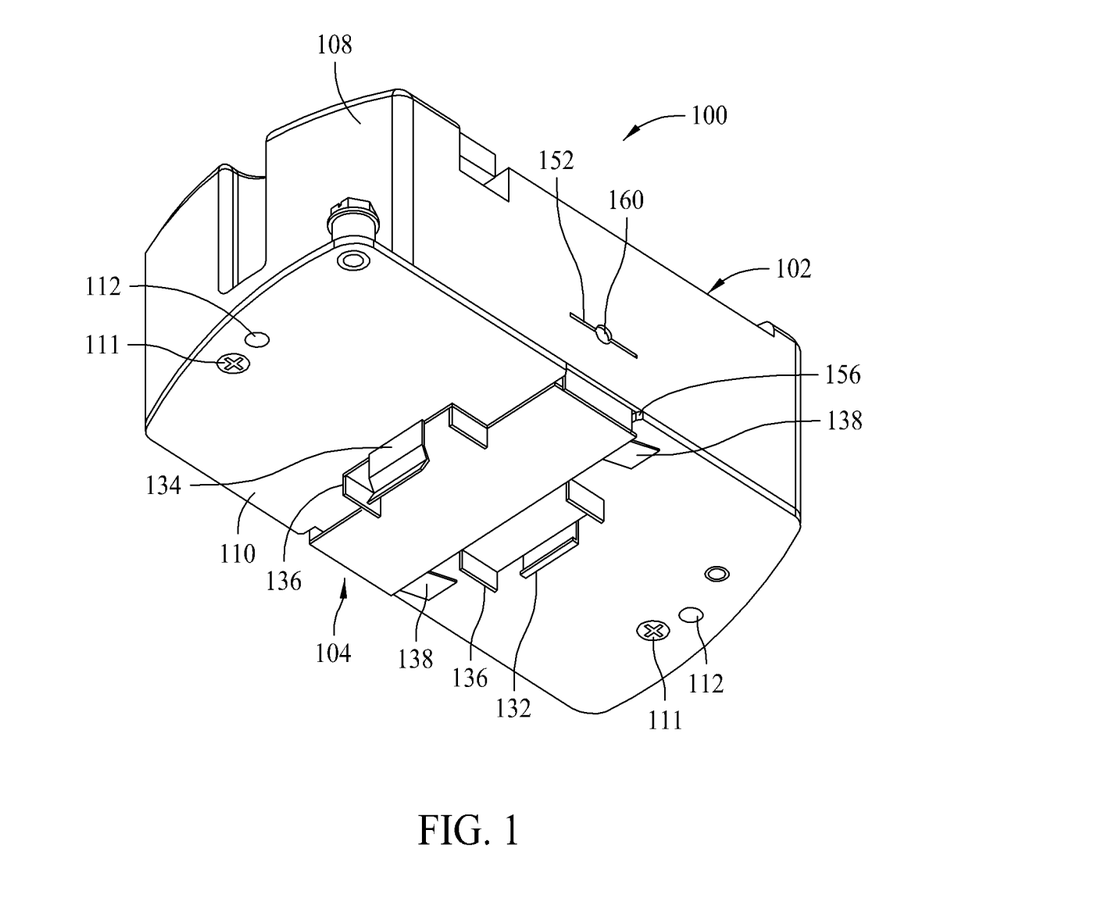
FIG. 1 is a rear perspective of an assembly including an electronic device and a mounting adapter.

Referring now to the drawings, FIG. 1 is a bottom perspective of an assembly, generally indicated at 100, including an electronic device, generally indicated at 102, and a mounting adapter, generally indicated at 104. In the illustrated embodiment, the electronic device is in the form of an industrial radio device. It is understood, however, that the device 102 may be another type of electronic device. The illustrated mounting adapter 104 is adapted for removable attachment to the illustrated radio device 102 and is adapted for mounting the radio device on a top-hat or DIN rail, generally indicated at 106 in FIGS. 9-11, as explained in more detail below. It is understood that the mounting adapter 104 may be configured for removable attachment to other types of electronic devices. The following disclosure discusses the construction and use of the illustrated radio device 102 and the illustrated mounting adapter 104, and is provided solely for purposes of illustration rather than limitation.

Figure 2:
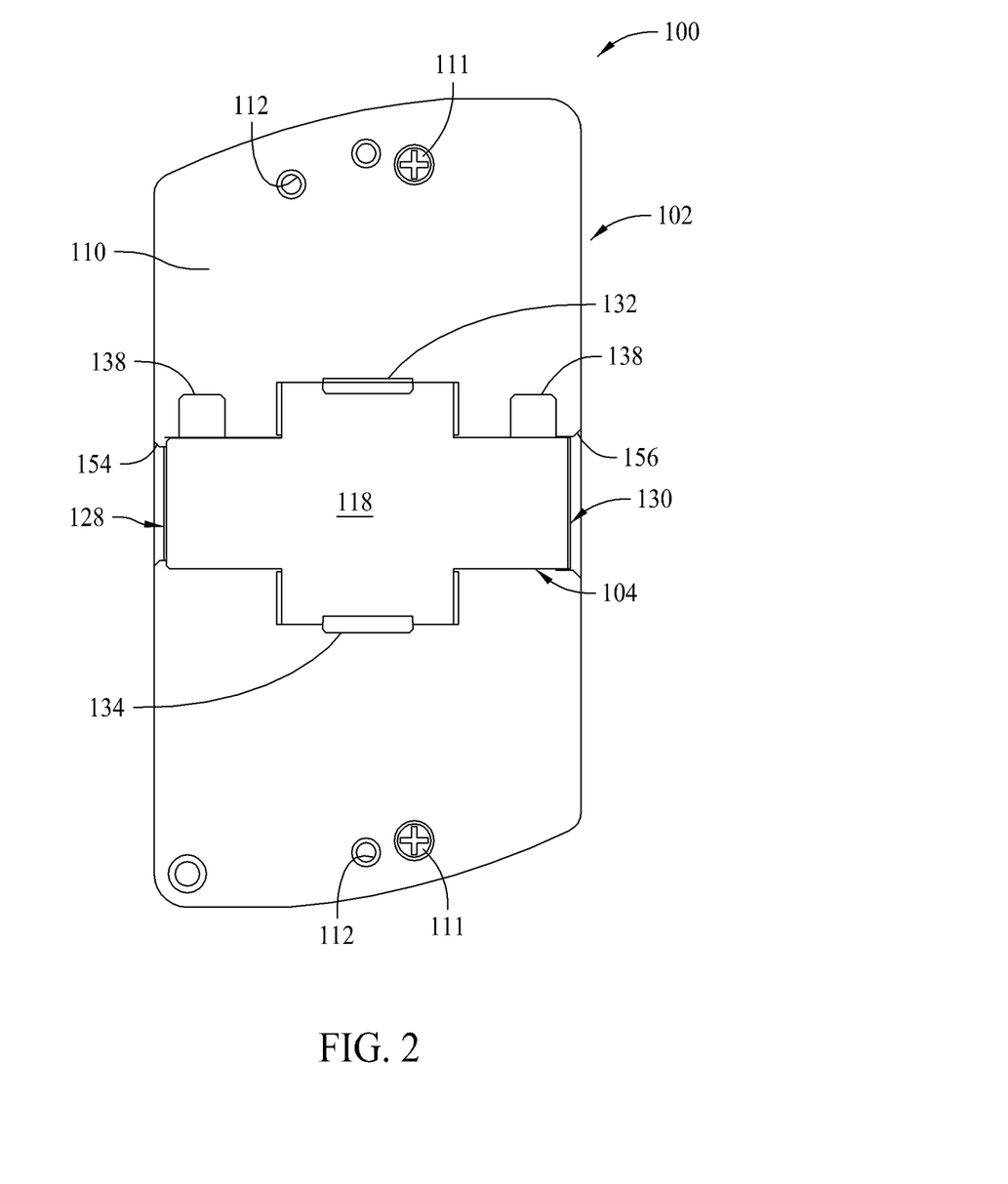
FIG. 2 is a rear elevational view of the assembly shown in FIG. 1.
Figure 3:
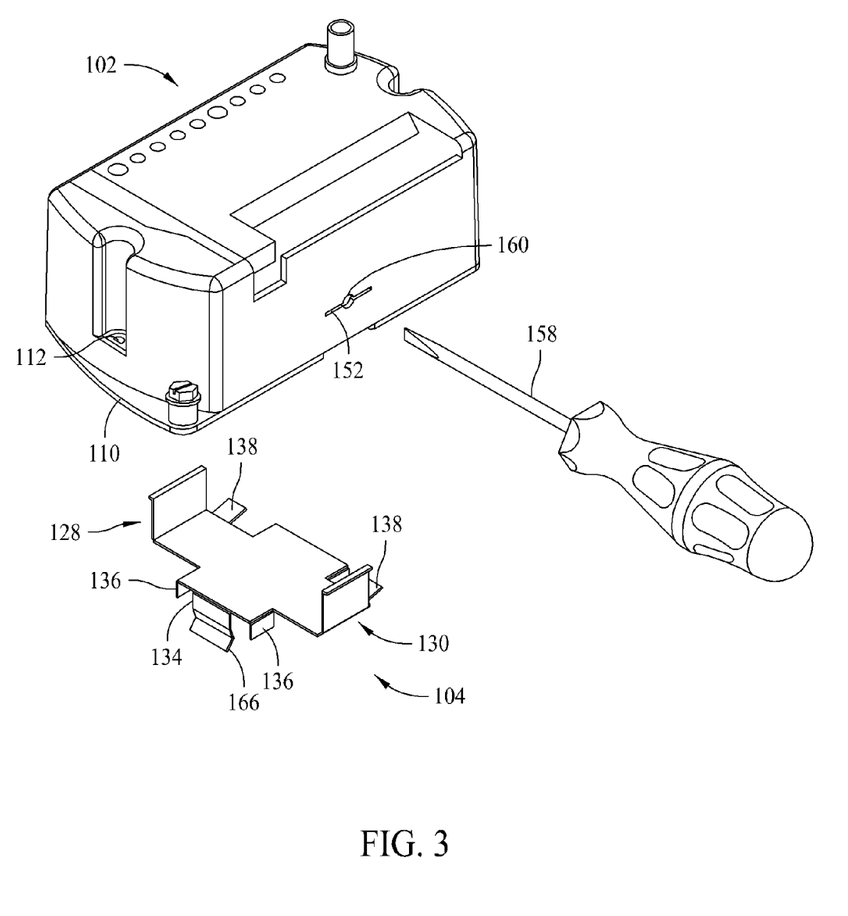
FIG. 3 is an exploded front perspective of the assembly shown in FIG. 1.
Figure 4:
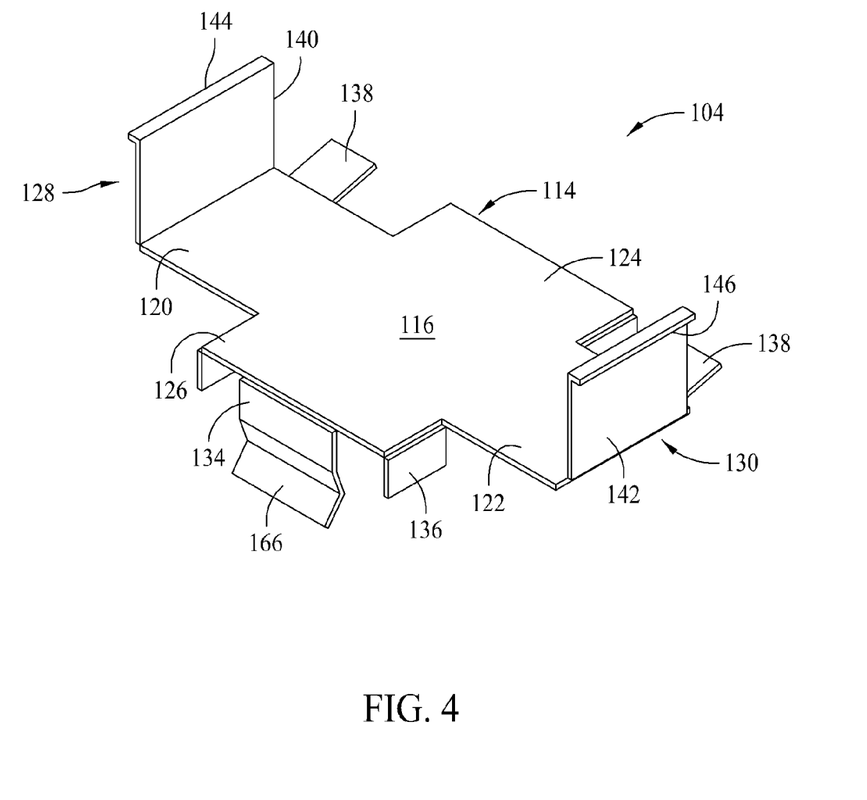
FIG. 4 is a front perspective of the mounting adapter shown in FIG. 1.
Figure 5:
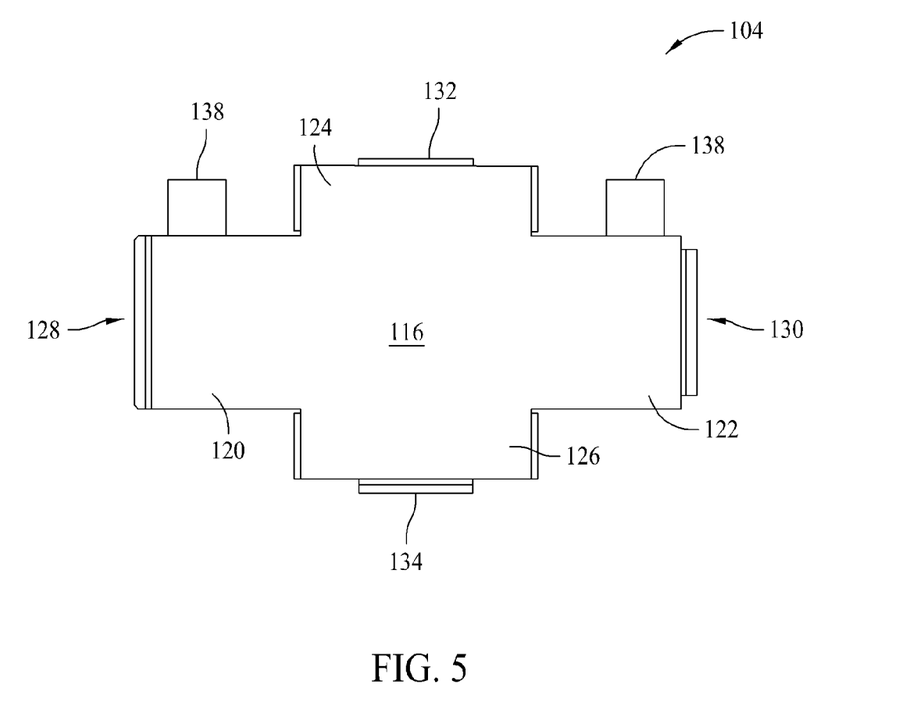
FIG. 5 is a front elevational view of the mounting adapter shown in FIG. 4.
Figure 6:
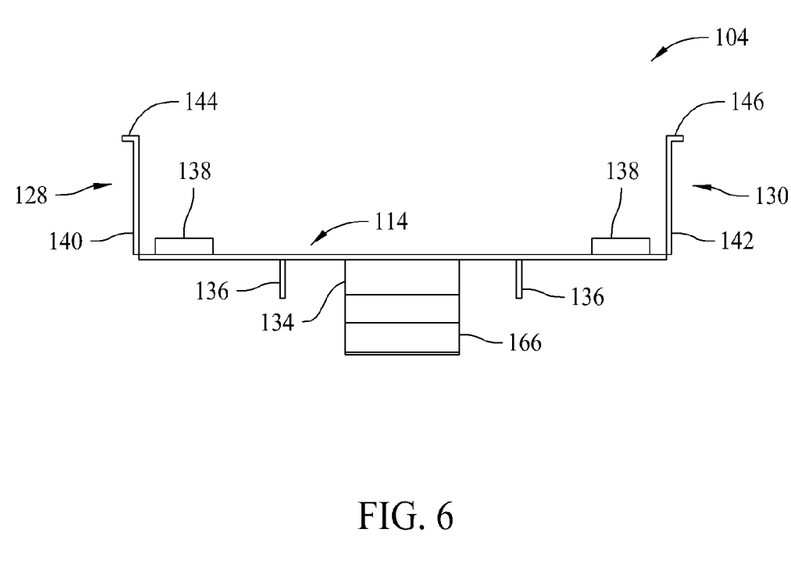
FIG. 6 is a bottom plan view of the mounting adapter shown in FIG. 4.

Referring to FIGS. 1-3, the illustrated radio device 102 is a programmable processor-based device including a cover 108 secured to a back plate 110; together the cover 108 and the back plate 110 define a housing enclosing suitable electrical and/or electronic components of the radio device 102. The cover 108 may be formed, e.g., molded, from a plastic material, and the back plate 110 may be formed from metal, such as stainless steel, or other thermally and electrically conductive material. A pair of screws 111 secures the cover 108 to the back plate 110. Aligned openings 112 extending through the cover 108 and the back plate 110 are sized and shaped to receive suitable fasteners (e.g., screws, not shown) to secure the device 102 directly to a wall or panel in an equipment rack when the mounting adapter 104 is not attached to the device, as explained in more detail below. The housing may be formed in other ways and may take on other configurations without departing from the scope of the present invention.

The electrical and/or electronic components enclosed in the housing of the radio device 102 may be mounted on a circuit board (not shown) and configured to implement the functionality of the device. Components mounted on the circuit board may be generally known in the art, and may include a radio transmission element, such as a transmitter and a receiver or a transceiver, a processor and a memory storage wherein executable instructions, commands, and control algorithms, as well as other data and information such as communication network and protocol parameters required to satisfactorily operate the radio device 102 are stored. In one embodiment, the circuit board and, in turn, the electrical and/or electronic components of the radio device 102 are in thermal contact with the back plate 110 such that the back plate functions as a heat sink that transfers heat from the electrical and/or electrical components to ambient air outside the device. A thermal pad (not shown) may be disposed in the housing between the circuit board and the back plate 110 to facilitate effective heat transfer. It is understood that the radio device 102 may have other configurations and may include other electrical and/or electronic components without departing from the scope of the present invention.

As shown best in FIGS. 4-8, the illustrated mounting adapter 104 includes a central body, generally indicated at 114, in the form of a cross-shaped plate. The body 114 has substantially planar front and rear faces 116, 118, respectively; opposite left and right end margins 120, 122, respectively; and opposite upper and lower end margins 124, 126, respectively. Opposing left and right detents, generally indicated at 128, 130, respectively, project forward from the respective left and right end margins 120, 122 of the body 114. As explained in more detail below, the detents 128, 130 are used to releasably attach the mounting adapter 104 to the radio device 102. The mounting adapter 104 also includes opposing upper and lower rail attaching members 132, 134 and rail spacers 136 projecting rearward from the respective upper and lower end margins 124, 126 of the body 114. As also explained in more detail below, the rail attaching members 132, 134 are used to releasably attach the mounting adapter 104, and in turn the radio device 102, to the DIN rail 106. Ground tabs 138 also project from the body 114, the structure and function of which is also discussed below.

Referring still to FIGS. 4-8, each of the left and right detents 128, 130 includes a resiliently deflectable arm portion 140, 142, respectively, extending forward from the body 114, and a catch portion 144, 146 projecting laterally outward from a terminal end margin of the corresponding arm portion. In the illustrated embodiment, the arm portions 140, 142 are resiliently deflectable toward one another. The arm portions 140, 142 may be resiliently pivotable about hinge lines at the junctures of the arm portions and the body 114, and/or the arm portions may be resiliently deflectable or bendable along their respective lengths. The catch portions 144, 146 are substantially rigid and project away from one another in opposite directions. The detents 128, 130 may be of other configurations without departing from the scope of the invention. Moreover, the mounting adapter 104 may include any number of detents, including a single detent or more than two detents. Further, the detent(s) may be disposed at other locations on the body 114 and/or may be positioned on adjacent end margins of the body without departing from the scope of the invention.

As mentioned above, the illustrated detents 128, 130 are used to releasably secure the mounting adapter 104 to the radio device 102. In particular, the detents 128, 130, more specifically the catch portions 144, 146 of the detents, are adapted to seat in detent seats defined by respective left and right seat openings 152 (only the right seat opening is visible in the drawings) extending through left and right sidewalls of the cover 108. The seat openings 152 are generally slot-shaped and are sized and shaped to snugly receive the respective catch portions 144, 146. In other embodiments, the detent seats may be of configurations other than the illustrated seat openings 152. For example, the detent seats may be in the form of grooves, or ledges, or lips, or other structures in which the catch portions of the detents may be seated. Moreover, the detent seats may be formed as part of the cover or may be formed separate from the cover.

Methodology for and steps associated with attaching the mounting adapter 104 to the radio device 102 are in part apparent and in part specifically described below and are included within the scope of the present invention. To attach the mounting adapter 104 to the radio device 102, a user, such as a field technician, resiliently deflects the arm portions 140, 142 of the left and right detents 128, 130, such as by squeezing the detents between a thumb and a forefinger, to pivot the detents toward one another. In this deflected configuration, the catch portions 144, 146 can be inserted into the cover 108 through respective left and right openings 154, 156 in the back plate 110 (FIG. 2). Once positioned in the cover 108, the catch portions 144, 146 contact the interior surface of the cover to retain the detents 128, 130 in their deflected configurations. The user then slides the arm portions through the openings 154, 156 in the back plate and into the cover 108; the openings 154, 156 act as guides that guide the detents 128, 130 to the respective seat openings 152 in the cover 108. The cover 102 may include guides or ramps, such as channels or ramps formed in the sidewalls of the cover, that guide the detents 128, 130 to the seat openings 152. When the catch portions 144, 146 reach the respective seat openings 152, the arm portions 140, 142 spring or rebound to their original configuration and the catch portions 144, 146 enter and seat in the seat openings.

In the illustrated embodiment, to release the mounting adapter 104 from the radio device 102, the catch portions 144, 146 must be unseated or removed from the respective seat openings 152. To unseat the catch portions 144, 146, the arm portions 140, 142 are deflected inward toward one another. To remove or unseat the catch portions 144, 146, a tool, such as a screwdriver 158 (FIG. 3) or other tool having an elongate end portion (e.g., a head), may be inserted into the seat openings 152 to contact the respective catch portions and deflect the arm portions. In the illustrated embodiment, each of the seat openings 152 includes an enlarged central portion (i.e., a circular cutout) 160 that is sized and shaped to receive the head of the screwdriver 158 or other tool. In the illustrated embodiment, to inhibit incidental unseating or removal of the catch portions 144, 146 from the seat openings 152, the catch portions do not protrude from the respective seat openings. In other words, the terminal ends of the catch portions 144, 146 do not extend beyond the exterior surface of the cover 108. The seat openings 152 may be of other configurations without departing from the scope of the present invention.

In other embodiments, the arm portions of the detents may extend along the exterior of the housing, instead of extending into the housing, when the mounting adapter is secured to the electronic device. In such an embodiment, the arm portions of the detents may be resiliently deflectable away from one another, and the catch portions may project toward one another so that the catch portions seat in the seat openings in the cover of the device. It is also contemplated that other portions of the detents may be resiliently deflectable. In one example, the arm portions of the detents may be fixed relative to the body of the mounting adapter and the catch portions may be resiliently deflectable. In another example, both the arm portions and the catch portions may be resiliently deflectable. It is further contemplated that the detent seat itself, or some portion thereof, may be resiliently deflectable to allow the detent to be removed from the seat. In such an embodiment, the detents may or may not be resiliently deflectable.

Figure 7:
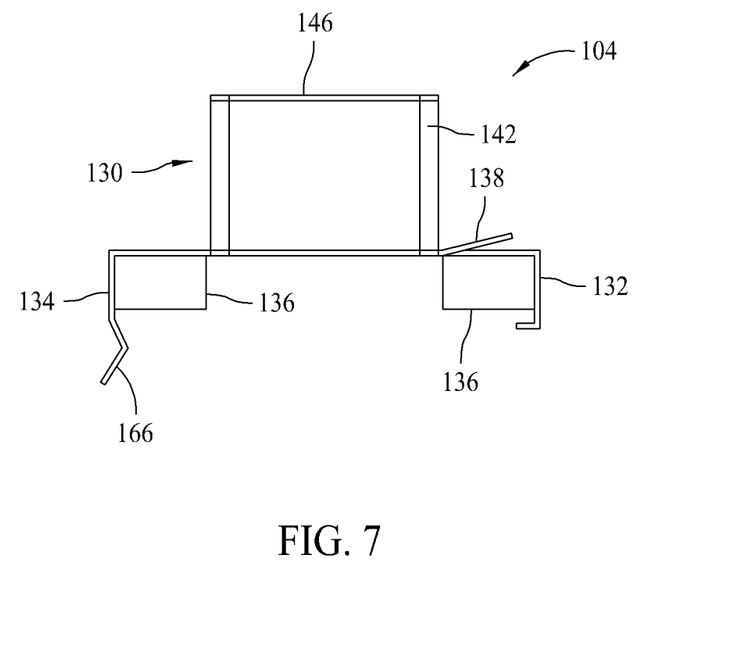
FIG. 7 is a right elevational view of the mounting adapter shown in FIG. 4.
Figure 8:
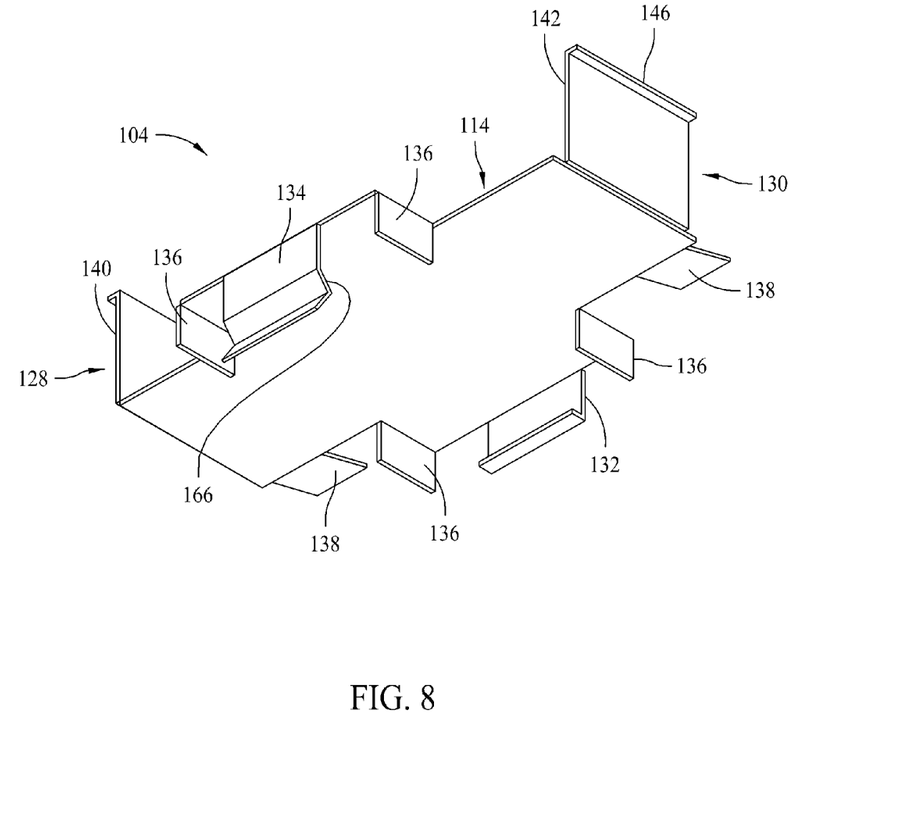
FIG. 8 is a rear perspective of the mounting adapter shown in FIG. 4.

As mentioned above and shown best in FIGS. 4-8, the illustrated mounting adapter 104 also includes electrically conductive ground tabs 138 projecting forward and laterally outward from the upper end margin of 124 the body 114. In other embodiments, the mounting adapter may include a single ground tab or more than two ground tabs, and the ground tab(s) may project forward and laterally outward from other portions of the body. In the illustrated embodiment, each of the ground tabs 138 has a front face 180 lying in a plane that intersects the front face 116 of the body 114 at an obtuse angle (FIG. 7). For example, the obtuse angle may measure from about 170 degrees to about 120 degrees, and in one example, may measure about 150 degrees. The ground tabs 138 are resiliently deflectable at least rearward and are adapted to contact the back plate 110 of the electronic device 102 when the mounting adapter 104 is attached to the device. More specifically, during attachment of the adapter 104 to the device 102, the ground tabs 138 resiliently deflect rearward as the tabs contact the back plate 110 so that the tabs are biased in contact with the back plate. In this way, the ground tabs 138 provide good electrical connections between the back plate 110 and the mounting adapter 104 so that the mounting adapter 104 suitably grounds the device 102 to the DIN rail 106 when the device is mounted thereon. The ground tabs may be of other configurations without departing from the scope of the invention. Moreover, it is understood that the mounting adapter may not include any ground tabs 138 without departing from the scope of the present invention.

As mentioned above and shown in FIGS. 9-11, the upper and lower rail attaching members 132, 134 are used to releasably attach the assembly 100 (i.e., the mounting adapter 104 and the radio device 102) to the DIN rail 106. The upper rail attaching member 132 is generally in the form of a substantially rigid L-shaped hook projecting rearward from the body 114. The lower rail attaching member 134 is resiliently deflectable and includes a V-shaped portion 166 at its terminal end margin having its crest or apex facing the upper rail attaching member 132. Together, the upper and lower rail attaching members 134 and the body 114 define and function as a clip that releasably attaches to the DIN rail 106. The rail spacers 136, which are in the form of four rigid tabs, contact a front side of the DIN rail 106. The spacers 136 space the rear face 118 of the body 114 from the rail 106 and facilitate tight engagement between the rail attaching members 132, 134 and the DIN rail 106.

Figure 9:
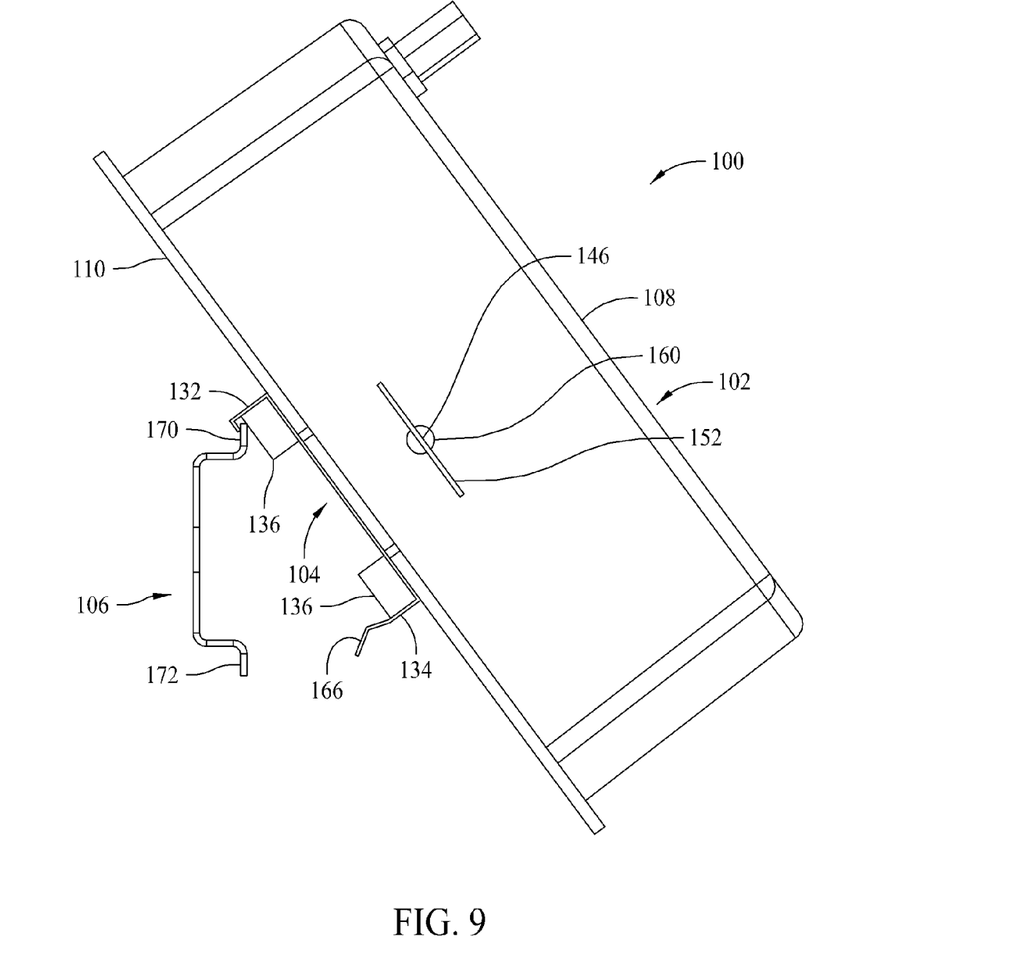
FIG. 9 is a left elevational view of the assembly in FIG. 1 in a first position during mounting of the assembly on a DIN rail, whereby an upper rail attaching member of the mounting adapter hooks onto an upper flange of the DIN rail.
Figure 10:
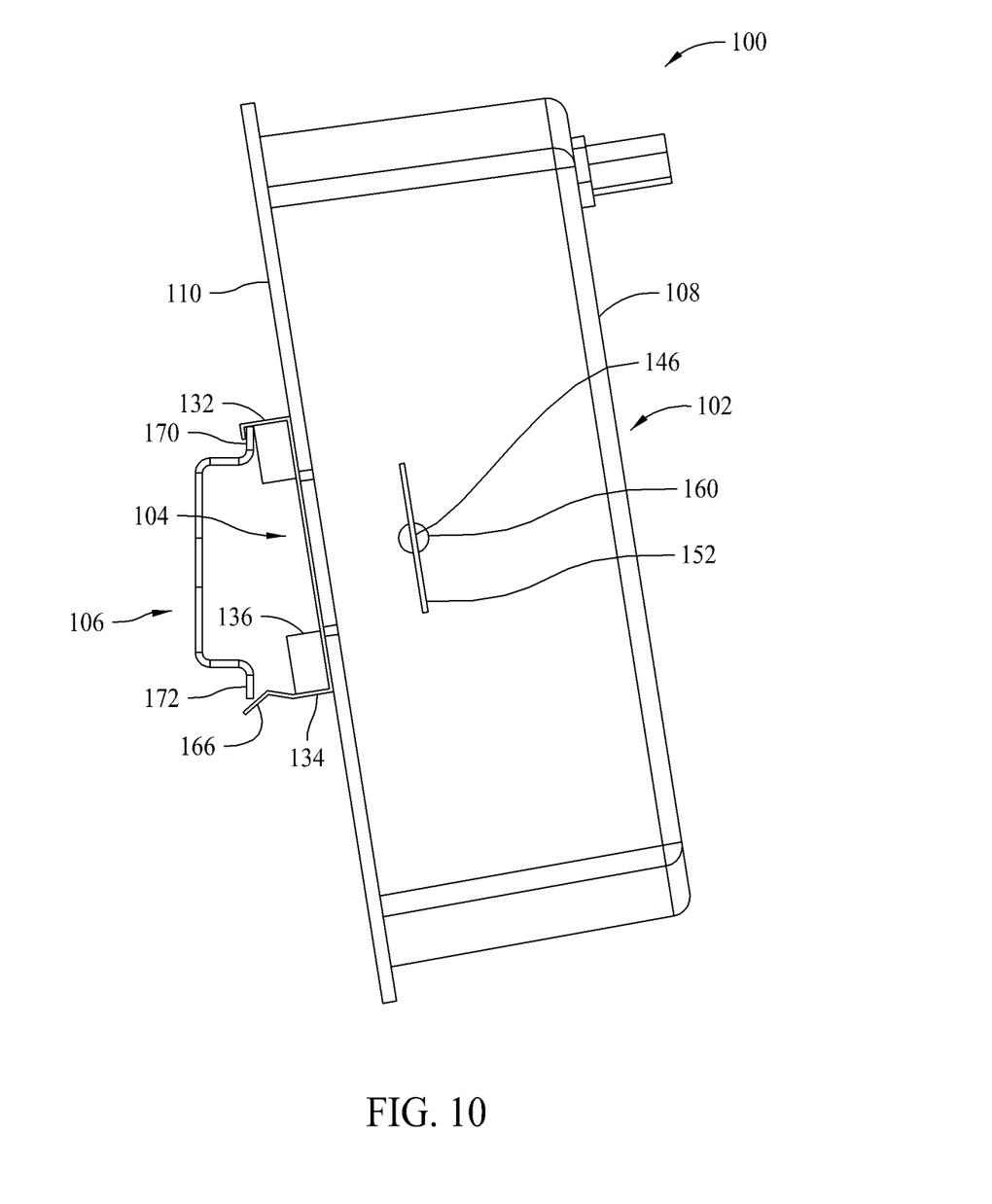
FIG. 10 is a left elevational view of the assembly in FIG. 1 in a second position during mounting of the assembly on the DIN rail, whereby a lower rail attaching member of the mounting adapter resiliently deflects as it contacts a lower flange of the DIN rail.
Figure 11:
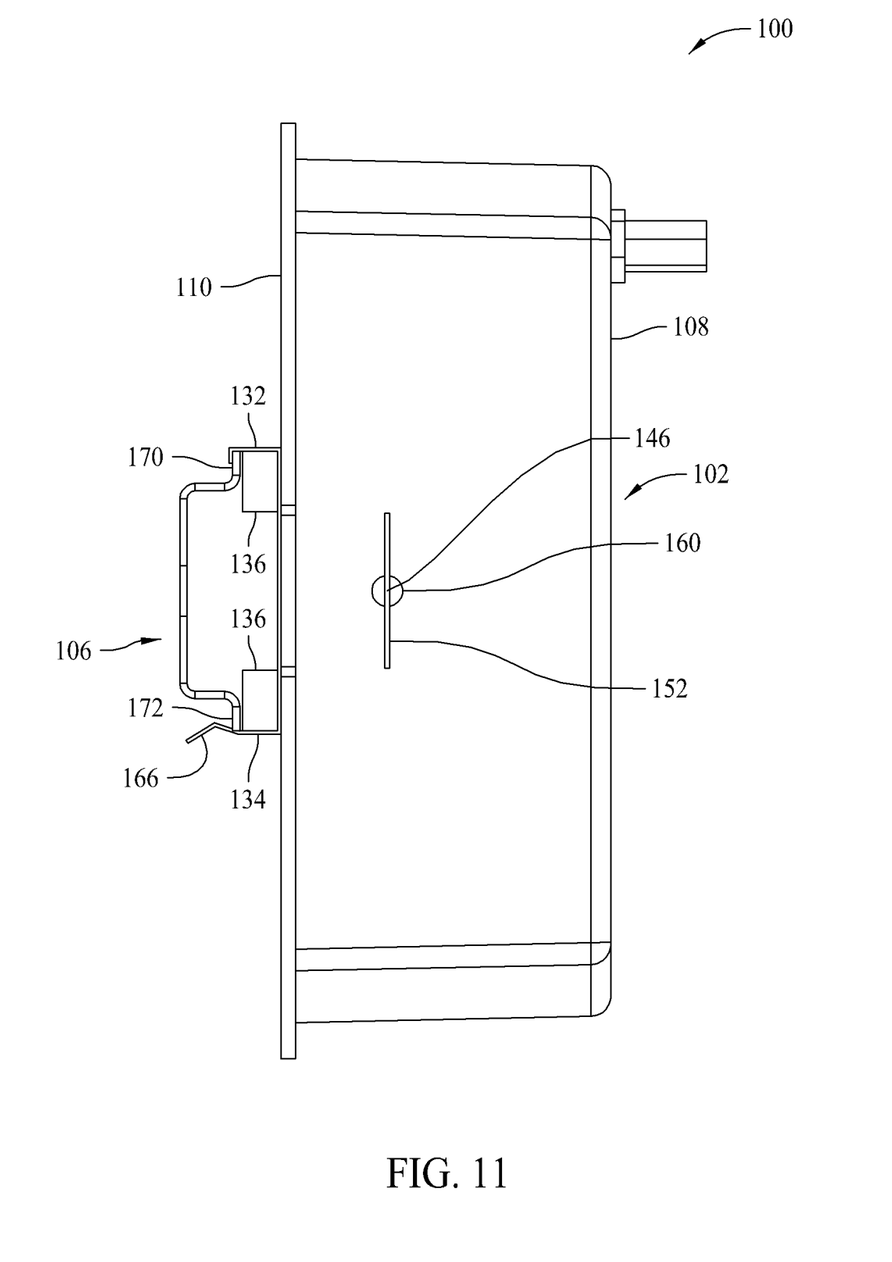
FIG. 11 is a left elevational view of the assembly in FIG. 1 mounted on the DIN rail.

Methodology for and steps associated with attaching the assembly 100 to the DIN rail 106 and removing the assembly from the DIN rail are in part apparent and in part specifically described below and are included within the scope of the present invention. As shown in FIGS. 9-11, the DIN rail 106 includes upper and lower flanges 170, 172. To releasably attach the assembly 100 to the DIN rail 106, the upper rail attaching member 132 of the mounting adapter 104 is hooked onto the upper flange 170 of the DIN rail so that two of the spacers 136 contact the front side of the DIN rail (FIG. 9). The adapter 104 is then pivoted downward, whereupon the V-shaped portion 166 of the lower rail attaching member 134 contacts the lower flange 172 of the DIN rail 106 (FIG. 11). As the adapter 104 is pivoted further, the lower flange 172 of the rail 106 maintains contact with the V-shaped portion 166 causing the lower rail attaching member 134 to resiliently deflect laterally outward until the apex of the V-shaped portion 166 passes over the lower flange. Upon the apex of the V-shaped portion 166 passing over the lower flange 172, the lower rail attaching member 134 begins to rebound or spring back toward the lower flange, whereupon the V-shaped portion is disposed on the back side of the DIN rail 106 and the remaining two spacers 136 are in contact with the front side of the rail, and the assembly 100 attaches to the DIN rail (FIG. 12).

The technician or other person can remove the assembly 100 from the DIN rail 106 by pulling downward on and deflecting the V-shaped portion 166 of the lower rail attaching member 134 so that the apex of the V-shaped portion can clear the lower flange 172; then pivoting the assembly upward, about the attachment of the upper rail attaching member 132 and the upper flange 170 of the DIN rail 106 to release the lower rail attaching member 134 from the lower flange 172. After the lower rail attaching member 134 is released, the upper rail attaching member 132 can be removed from the upper flange 170 by lifting the assembly upward.

In one embodiment, the mounting adapter 104 may be integrally formed as one-piece, and in one example, the mounting adapter may have substantially equal thicknesses. The mounting adapter 104 may be suitably fabricated from stock sheet metal, such as spring-grade stainless steel, or other suitable materials known in the art. In an exemplary operation, the stock sheet metal is cut into a blank, and the blank is bent along bend lines to form the detents 128, 130, the rail attaching members 132, 134, the spacers 136, and the ground tabs 138. The fabrication of the mounting adapter 104 may be performed in a single step or multiple steps. Other ways of forming the mounting adapter 104 do not depart from the scope of the present invention.

It is envisioned that the mounting adapter 104 may be sold as an accessory for one or more types of electronic devices 102. The mounting adapter 104 and the electronic device 102 may be sold together as the assembly 100, such that the two devices are assembled in a package and sold together. With such a commercial embodiment, the technician in the field may attach the assembly 100 to the DIN rail 106 without further configuring the assembly. Alternatively, if the technician wishes to attach the electronic device 102 directly to a wall or panel and not to the DIN rail 106, the technician can quickly and easily remove the mounting adapter 104 from the device 102 by deflecting the detents 128, 130, such as by inserting the screwdriver 158 into the seat openings 152 and contacting the catch portions 144, 146, and withdrawing the detents from the device, as explained above. Moreover, if the technician changes his mind after detaching the mounting adapter 104 and wishes to mount the device 102 on the DIN rail 106, the technician can quickly and easily assemble the assembly 100 without using any tools, such as in the manner discussed above.

In another embodiment, the mounting adapter 104 and the electronic device 102 may be packaged and sold as a disassembled product (i.e., the mounting adapter detached from the electronic device) or the mounting adapter may be sold entirely separate from the electronic device 102. In either of these embodiments, the technician in the field can either mount the electronic device 102 directly to a wall or panel, such as by using screws received in the openings 112, or attach the mounting adapter 104 to the device and attach the assembly 100 to the DIN rail 106.

The benefits and advantages of the invention are now believed to be amply illustrated in the exemplary embodiments disclosed.

A mounting adapter for mounting a device on a support rail having upper and lower flanges has been disclosed. The mounting adapter includes: a central body; at least one rail attaching member projecting rearward from the body, the at least one rail attaching member being configured for releasable attachment to at least one of the upper and lower flanges of the support rail; at least one detent projecting forward from the body, the at least one detent being resiliently deflectable relative to the body and being configured for releasable attachment to the device.

Optionally, the body may have opposite left and right end margins, and the at least one detent may include left and right detents projecting forward from the respective left and right end margins of the body. Each of the left and right detents may include a resiliently deflectable arm portion projecting forward from the body, and a substantially rigid catch portion projecting laterally outward from a terminal end margin of the arm portion. The resiliently deflectable arm portions may be resiliently deflectable at least toward one another, and the catch portions may project from the terminal end margins of the arm portions in opposite directions away from one another. The at least one rail attaching member may comprise upper and lower rail attaching members projecting rearward from the body, and at least one of the upper and lower rail attaching members may be resiliently deflectable for releasable attachment to a corresponding one of the upper and lower flanges of the support rail.

The body, the at least one rail attaching member, and the at least one detent may have substantially equal thicknesses and may be integrally formed as a one-piece component.

At least one ground tab may project forward from the body, and the ground tab may be adapted to contact a back plate of the device when the mounting adapter is attached to the device. The at least one ground tab may be adapted to resiliently deflect rearward when the tab contacts the back plate of the device. The body and the at least one ground tab may have substantially planar front faces, and the front face of the at least one ground tab may lie in a plane that intersects the front face of the body at an obtuse angle.

At least one spacer may project rearward from the body and may be configured to contact a front face of the support rail when the at least one rail attaching member is attached to the support rail. The support rail may be a DIN rail. The device may be an electronic device, and may be a radio device.

Another embodiment of an assembly configured for releasable attachment to a support rail having upper and lower flanges is also disclosed including: a device including at least one detent seat, a mounting adapter attachable to the device, the mounting adapter including at least one rail attaching member configured for releasable attachment to the support rail to releasably attach the assembly to the support rail, and at least one detent removably mountable in the at least one detent seat of the device to releasably attach the mounting adapter to the device, at least one of the detent and the detent seat being resiliently deflectable to allow for selective removal of the detent from the detent seat.

The assembly may further include a body, where the at least one detent includes a resiliently deflectable arm portion projecting forward from the body, and a catch portion projecting laterally outward from a terminal end margin of the arm portion. The device may further include a housing having a sidewall, where the at least one detent seat being defined by a seat opening extending through the sidewall of the housing, and the arm portion of the at least one detent is extendable into the housing, and the catch portion of the at least one detent is removably receivable in the seat opening. The seat opening may be generally slot-shaped. The seat opening may have an enlarged central portion sized and shaped to receive a tool for contacting the catch portion and resiliently deflecting the arm portion to remove the catch portion from the detent seat when the catch portion is received in the seat opening.

The device may further include a cover and a back plate secured to the cover to at least partially define a housing, where the at least one detent is extendable through an opening in the back plate and into the housing. The device may further include a cover and an electrically conductive back plate secured to the cover to at least partially define a housing, where the mounting adapter further includes at least one electrically conductive ground tab resiliently deflectable in direct, electrical contact with the back plate when the mounting adapter is attached to the device.

The at least one rail attaching member may include upper and lower rail attaching members projecting rearward from the body for releasable attachment to corresponding ones of the upper and lower flanges of the support rail, and at least one of the upper and lower rail attaching members may be resiliently deflectable for releasable attachment to the corresponding one of the upper and lower flanges of the support rail. At least one spacer may project rearward from the body, and the at least one spacer may be configured to contact a front face of the support rail when the upper and lower rail attaching members are attached to the corresponding ones of the upper and lower flanges of the support rail. The at least one detent seat may comprise left and right detent seats, and the mounting adapter may include a body having opposite left and right end margins, and opposite upper and lower end margins, and the at least one detent may comprise left and right detents projecting forward from the respective left and right end margins of the body, where the left and right detents being seatable in the respective left and right detent seats.

The support rail may be a DIN rail. The device may be an electronic device and may be a radio device. The device may be adapted to be mounted directly on a wall when the mounting adapter is unattached to the device. The device may have openings for receiving fasteners to mount the device directly on a wall when the mounting adapter is unattached to the device.

Yet another assembly configured for releasable attachment to a support rail having upper and lower flanges is disclosed including: a device including at least one detent seat, a mounting adapter removably attached to the device, the mounting adapter including at least one rail attaching member configured for releasable attachment to the support rail to releasably attach the assembly to the support rail, and at least one detent removably seated in the at least one detent seat of the device to releasably attach the mounting adapter to the device, at least one of the detent and the detent seat being resiliently deflectable to allow for selective removal of the detent from the detent seat.

Optionally, the mounting adapter may include a body, and the at least one detent may include a resiliently deflectable arm portion projecting forward from the body, and a catch portion projecting laterally outward from a terminal end margin of the arm portion. The device may include a housing having a sidewall, and the at least one detent seat may be defined by a seat opening extending through the sidewall of the housing, and the arm portion of the at least one detent may extend into the housing, and the catch portion of the at least one detent may be removably received in the seat opening. The seat opening may have an enlarged central portion sized and shaped to receive a tool for contacting the catch portion and resiliently deflecting the arm portion to remove the catch portion from the detent seat.

The device may include a cover and an electrically conductive back plate secured to the cover to at least partially define a housing, and the mounting adapter may further include at least one electrically conductive ground tab resiliently deflected in direct, electrical contact with the back plate. The support rail may be a DIN rail. The device may be an electronic device, and the electronic device may be a radio device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A mounting adapter for mounting a device on a support rail having upper and lower flanges, the mounting adapter comprising:
   a body;
   at least one rail attaching member projecting rearward from the body, the at least one rail attaching member being configured for releasable attachment to at least one of the upper and lower flanges of the support rail;
   at least one detent projecting forward from the body, the at least one detent being resiliently deflectable relative to the body and being configured for releasable attachment to the device; and
   at least one ground tab projecting forward from the body, the ground tab being adapted to contact a back plate of the device when the mounting adapter is attached to the device.

2. The mounting adapter of claim 1, wherein the body has opposite left and right end margins, wherein the at least one detent comprises left and right detents projecting forward from the respective left and right end margins of the body.

3. The mounting adapter of claim 2, wherein each of the left and right detents includes a resiliently deflectable arm portion projecting forward from the body, and a substantially rigid catch portion projecting laterally outward from a terminal end margin of the arm portion.

4. The mounting adapter of claim 3, wherein the resiliently deflectable arm portions are resiliently deflectable at least toward one another, and wherein the catch portions project from the terminal end margins of the arm portions in opposite directions away from one another.

5. The mounting adapter of claim 4, wherein the at least one rail attaching member comprises upper and lower rail attaching members projecting rearward from the body, at least one of the upper and lower rail attaching members being resiliently deflectable for releasable attachment to a corresponding one of the upper and lower flanges of the support rail.

6. The mounting adapter of claim 1, wherein the body, the at least one rail attaching member, and the at least one detent have substantially equal thicknesses and are integrally formed as a one-piece component.

7. The mounting adapter of claim 1, wherein the at least one ground tab is adapted to resiliently deflect rearward when the tab contacts the back plate of the device.

8. The mounting adapter of claim 7, wherein the body and the at least one ground tab have substantially planar front faces, wherein the front face of the at least one ground tab lies in a plane that intersects the front face of the body at an obtuse angle.

9. The mounting adapter of claim 1, further comprising at least one spacer projecting rearward from the body, the at least one spacer being configured to contact a front face of the support rail when the at least one rail attaching member is attached to the support rail.

10. The mounting adapter of claim 1, wherein the support rail is a Deutsche Industrie Normen ("DIN") rail.

11. The mounting adapter of claim 1, wherein the device is an electronic device.

12. The mounting adapter of claim 11, wherein the electronic device is a radio device.

13. An assembly configured for releasable attachment to a support rail having upper and lower flanges, the assembly comprising:
    a device including at least one detent seat,
    a mounting adapter attachable to the device, the mounting adapter including:
       a body;
       at least one rail attaching member configured for releasable attachment to the support rail to releasably attach the assembly to the support rail, wherein the at least one rail attaching member comprises upper and lower rail attaching members projecting rearward from the body for releasable attachment to corresponding ones of the upper and lower flanges of the support rail, at least one of the upper and lower rail attaching members being resiliently deflectable for releasable attachment to the corresponding one of the upper and lower flanges of the support rail;
       at least one detent removably mountable in the at least one detent seat of the device to releasably attach the mounting adapter to the device, at least one of the detent and the detent seat being resiliently deflectable to allow for selective removal of the detent from the detent seat; and
       at least one spacer projecting rearward from the body, the at least one spacer being configured to contact a front face of the support rail when the upper and lower rail attaching members are attached to the corresponding ones of the upper and lower flanges of the support rail.

14. The assembly of claim 13, wherein the at least one detent includes a resiliently deflectable arm portion projecting forward from the body, and a catch portion projecting laterally outward from a terminal end margin of the arm portion.

15. The assembly of claim 14, wherein the device further includes a housing having a sidewall, the at least one detent seat being defined by a seat opening extending through the sidewall of the housing, wherein the arm portion of the at least one detent is extendable into the housing, and the catch portion of the at least one detent is removably receivable in the seat opening.

16. The assembly of claim 15, wherein the seat opening is generally slot-shaped.

17. The assembly of claim 16, wherein the seat opening has an enlarged central portion sized and shaped to receive a tool for contacting the catch portion and resiliently deflecting the arm portion to remove the catch portion from the detent seat when the catch portion is received in the seat opening.

18. The assembly of claim 13, wherein the device further includes a cover and a back plate secured to the cover to at least partially define a housing, wherein the at least one detent is extendable through an opening in the back plate and into the housing.

19. The assembly of claim 13, wherein the device further includes a cover and an electrically conductive back plate secured to the cover to at least partially define a housing, the mounting adapter further including at least one electrically conductive ground tab resiliently deflectable in direct, electrical contact with the back plate when the mounting adapter is attached to the device.

20. The assembly of claim 13, wherein the at least one detent seat comprises left and right detent seats, the body of the mounting adapter having opposite left and right end margins, and opposite upper and lower end margins, wherein the at least one detent comprises left and right detents projecting forward from the respective left and right end margins of the body, the left and right detents being seatable in the respective left and right detent seats.

21. The assembly of claim 13, wherein the support rail is a DIN rail.

22. The assembly of claim 13, wherein the device is an electronic device.

23. The assembly of claim 22, wherein the electronic device is a radio device.

24. The assembly of claim 13, wherein the device is adapted to be mounted directly on a wall when the mounting adapter is unattached to the device.

25. The assembly of claim 24, wherein the device has openings for receiving fasteners to mount the device directly on a wall when the mounting adapter is unattached to the device.

26. An assembly configured for releasable attachment to a support rail having upper and lower flanges, the assembly comprising:

a device including at least one detent seat, a cover and an electrically conductive back plate secured to the cover to at least partially define a housing; and     a mounting adapter removably attached to the device, the mounting adapter including:

at least one rail attaching member configured for releasable attachment to the support rail to releasably attach the assembly to the support rail, and         at least one detent removably seated in the at least one detent seat of the device to releasably attach the mounting adapter to the device, at least one of the detent and the detent seat being resiliently deflectable to allow for selective removal of the detent from the detent seat; and         at least one electrically conductive ground tab resiliently deflectable into direct, electrical contact with the back plate.

27. The assembly of claim 26, wherein the mounting adapter includes a body, the at least one detent including a resiliently deflectable arm portion projecting forward from the body, and a catch portion projecting laterally outward from a terminal end margin of the arm portion.

28. The assembly of claim 27, wherein the device further includes a housing having a sidewall, the at least one detent seat being defined by a seat opening extending through the sidewall of the housing, wherein the arm portion of the at least one detent extends into the housing, and the catch portion of the at least one detent is removably received in the seat opening.

29. The assembly of claim 28, wherein the seat opening has an enlarged central portion sized and shaped to receive a tool for contacting the catch portion and resiliently deflecting the arm portion to remove the catch portion from the detent seat.

30. The assembly of claim 26, wherein the support rail is a DIN rail.

31. The assembly of claim 26, wherein the device is an electronic device.

32. The assembly of claim 31, wherein the electronic device is a radio device.

\* \* \* \* \*